United States Patent
Rantala et al.

(10) Patent No.: US 11,811,376 B2
(45) Date of Patent: Nov. 7, 2023

(54) PREAMPLIFIER CIRCUIT

(71) Applicant: OXFORD INSTRUMENTS TECHNOLOGIES OY, Espoo (FI)

(72) Inventors: Arto Rantala, Espoo (FI); Hans Andersson, Vantaa (FI)

(73) Assignee: OXFORD INSTRUMENTS TECHNOLOGIES OY, Espoo (FI)

( * ) Notice: Subject to any disclaimer, the term of this patent is extended or adjusted under 35 U.S.C. 154(b) by 31 days.

(21) Appl. No.: 17/620,873

(22) PCT Filed: Jun. 10, 2020

(86) PCT No.: PCT/FI2020/050405
§ 371 (c)(1),
(2) Date: Dec. 20, 2021

(87) PCT Pub. No.: WO2020/260753
PCT Pub. Date: Dec. 30, 2020

(65) Prior Publication Data
US 2022/0345100 A1  Oct. 27, 2022

(30) Foreign Application Priority Data

Jun. 25, 2019 (EP) .................................. 19182191

(51) Int. Cl.
*H03F 3/70* (2006.01)
*G01T 1/24* (2006.01)

(52) U.S. Cl.
CPC .................. *H03F 3/70* (2013.01); *G01T 1/24* (2013.01); *H03F 2200/129* (2013.01)

(58) Field of Classification Search
CPC ........ H03F 3/70; H03F 2200/129; G01T 1/24
See application file for complete search history.

(56) References Cited

U.S. PATENT DOCUMENTS

| | | | | |
|---|---|---|---|---|
| 4,767,929 A | * | 8/1988 | Valentine | G01T 1/026 250/370.07 |
| 4,777,428 A | * | 10/1988 | Lundback | G01K 7/42 318/632 |

(Continued)

FOREIGN PATENT DOCUMENTS

| JP | 05180944 A | 7/1993 |
|---|---|---|
| JP | 06169247 A | 6/1994 |

(Continued)

OTHER PUBLICATIONS

International Search Report and Written Opinion dated Aug. 18, 2020 in PCT/FI2020/050405 (17 pages).

(Continued)

*Primary Examiner* — Hugh Maupin
(74) *Attorney, Agent, or Firm* — Meunier Carlin & Curfman LLC (57) ABSTRACT

Disclosed preamplifier circuit comprises amplifier arranged in first current path between input node and output node of the preamplifier circuit. Feedback capacitor is arranged in second current path between said input and output nodes. Feedback circuit having adjustable transfer function is arranged in third current path between said input and output nodes. Reset switch arranged in said third current path enables selectively coupling output of the feedback circuit to input of the amplifier and decoupling output of the feedback circuit from input of the amplifier. Loop controller is arranged selectively, in dependence of voltage in the preamplifier circuit, one of open reset switch to set preamplifier circuit in normal operating mode and close reset switch to set preamplifier circuit in reset mode. Loop controller is arranged to adjust the transfer function of the feedback circuit at least in part in dependence of the current operating mode of the preamplifier circuit.

15 Claims, 6 Drawing Sheets

(56) References Cited

U.S. PATENT DOCUMENTS

| | | | |
|---|---|---|---|
| 5,252,928 A | 10/1993 | Giorgetta | |
| 11,258,411 B2* | 2/2022 | Putzeys | H03F 3/2171 |
| 2007/0007438 A1 | 1/2007 | Liu et al. | |
| 2007/0158551 A1* | 7/2007 | Audebert | G01T 1/17 |
| | | | 250/306 |
| 2012/0080606 A1* | 4/2012 | Van Der Wal | H04N 5/32 |
| | | | 250/370.09 |

FOREIGN PATENT DOCUMENTS

| | | | |
|---|---|---|---|
| JP | 09008563 A | 1/1997 | |
| JP | 2003/279410 A | 10/2003 | |
| JP | 2012169712 A | 9/2012 | |

OTHER PUBLICATIONS

Xiangyu Li et al., "A Switched-reset 300e ENC 10mW readout ASIC in 180nm CMOS for CdZnTe Particle Detector", ASIC, 2009, IEEE 8th International Conference on, IEEE, Piscataway, NJ, USA, Oct. 20, 2009, pp. 305-308.

Office Action issued in Japanese Application No. 2021-575998 dated May 8, 2023, 12 pages.

* cited by examiner

PREAMPLIFIER CIRCUIT

CROSS REFERENCE TO RELATED APPLICATIONS

This application is a United States National Phase Patent Application of International Patent Application Number PCT/FI2020/050405, filed on Jun. 10, 2020, which claims priority to EP 19182191.7 filed on Jun. 25, 2019, the content of both of which are incorporated herein by reference in their entirety.

TECHNICAL FIELD

The present invention relates to a preamplifier circuit for a radiation detector and, in particular, to a control arrangement for a preamplifier circuit that employs a charge sensitive amplifier (CSA) for amplification of signals and that is suitable for use in radiation detection appliances.

BACKGROUND

A radiation detector may be applied as a component for detecting radiation (ionizing radiation or non-ionizing radiation), such as gamma rays, X-rays, ultraviolet (UV) radiation, visible radiation or charged particle radiation, e.g. in an analyzer device, in a spectrometer or in an electron microscope. A radiation detector typically serves to output an electrical output signal that is descriptive of the detected level of radiation. In the following, we refer to the electrical output signal from a radiation detector as a detector signal.

A non-limiting example of a radiation detector is a semiconductor drift detector (SDD), where a set of field electrodes is arranged to create a transversal electric field inside a block of semiconductor material, which electric field drives radiation-induced signal charges on one surface of the block of semiconductor material to a collection electrode that is typically located on the opposite surface of the block of semiconductor material. Consequently, the detector signal that is descriptive of the level of radiation detected by the SDD can be read out from the collection electrode.

Development of radiation detectors aims at achieving increased sensitivity, higher energy resolution, lower electronic noise and larger active detector area. While characteristics of a radiation detector as such play an important role in the resulting detection performance, a further crucial element in this regard is a preamplifier that is applied to amplify the detector signal before passing it for further processing by a signal processing system. In general, important characteristics of an applicable preamplifier include small physical size, low noise level, small rise and settling times and a linear response across a desired range of input signal levels.

Solid state charge sensitive amplifiers (CSA) have been widely used as preamplifiers for amplification of the electrical output signals from radiation detectors. A CSA enables amplification of an input current with a gain that is independent of the source capacitance. Therefore, CSAs are well suited to serve as preamplifiers in X-ray and particle detector applications for measuring charge pulses generated in the detector signals output from a radiation detector. A CSA may be provided, for example, by connecting an amplifier element in parallel with a feedback capacitor, where the amplifier element may be provided e.g. as a transimpedance amplifier.

Figure 1:
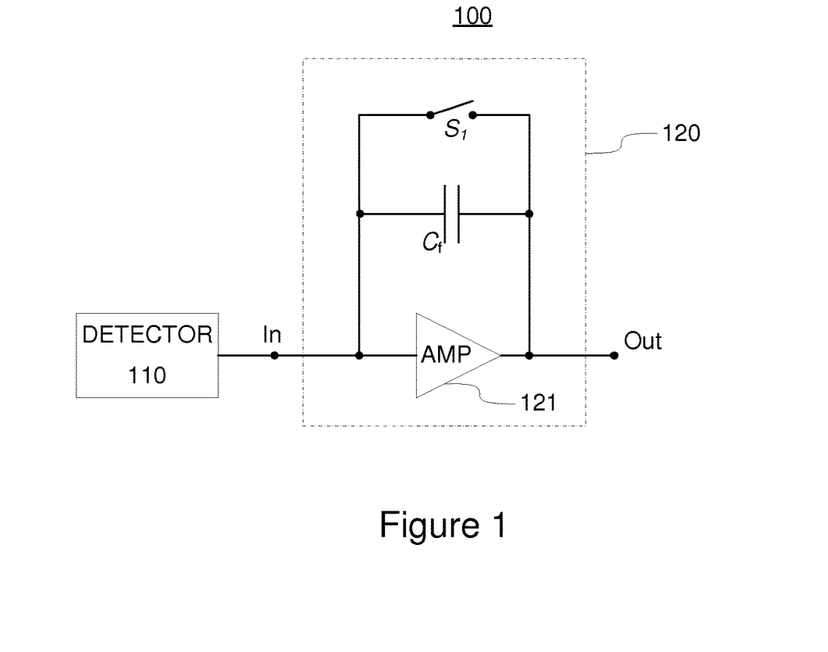

FIG. 1 schematically illustrates an example of using a CSA as a component of a preamplifier circuit for amplification of a detector signal from a radiation detector. In particular, FIG. 1 depicts a detector assembly 100 that includes a radiation detector element 110 and a preamplifier circuit 120, where a detector signal from the radiation detector element 110 is coupled to an input of the preamplifier circuit 120, which generates an amplified detector signal at its output that may be coupled to a signal processing system that is applied for processing the amplified detector signal. The input of the preamplifier circuit 120 is coupled to an input of an amplifier 121, whereas an output of the amplifier 121 is coupled to the output of the preamplifier circuit 120. In the preamplifier circuit 120, a feedback capacitor $C_f$ and a reset switch $S_1$ are coupled in parallel with the amplifier 121. In other words, both the feedback capacitor $C_f$ and the reset switch $S_1$ are coupled between the input and output of the amplifier 121. In the example of FIG. 1, the amplifier 121 and the feedback capacitor $C_f$ constitute the CSA. When the reset switch $S_1$ is open, the charge generated in the detector element 110 and provided to the input of the preamplifier circuit 120 is accumulated into the feedback capacitor $C_f$. Hence, the preamplifier circuit 120 basically operates as an integrator. For proper operation of the preamplifier circuit 120, the charge accumulated into the feedback capacitor $C_f$ needs to be periodically discharged to avoid saturation of the voltage at the output of the preamplifier circuit 120. In the example of FIG. 1, discharging of the feedback capacitor $C_f$ may be carried out by periodically closing the reset switch $S_1$ for a relatively short period of time.

The output of the preamplifier circuit 120 may be, optionally, coupled to the signal processing system that is applied for processing the amplified detector signal via a pull-down circuit or a pull-up circuit (not shown in FIG. 1). An advantage arising from usage of the pull-down/pull-up circuit is that it may contribute towards reducing electrical noise in the amplified detector signal and/or it may serve to provide electrostatic discharge (ESD) protection.

Still referring to the example of FIG. 1, a time period during which the reset switch $S_1$ is closed (and hence the charge accumulated to the feedback capacitor $C_f$ is discharging) may be referred to as a reset period (of the preamplifier circuit 120). During a reset period, the output of the preamplifier circuit 120 may be undefined and it may not be applicable as the amplified detector signal. For this reason, the reset period constitutes a 'dead time' of the output of the preamplifier circuit 120. Consequently, it is advantageous to keep the reset period as short as possible. Moreover, since a reset period provides an interruption to the amplification operation of the preamplifier circuit 120, prompt resumption of the normal operation after a reset period is highly desirable in order to keep the disturbance to detection performance arising from the reset periods as small as possible.

In this regard, the approach according to the example of FIG. 1 provides a simple solution for implementing the reset periods, while on the other hand straightforward application of such an approach results in oscillations as a result of a high loop gain during the reset period and any attempt to reduce the oscillations by electronic filtering typically results in a relatively slow reset and/or a period of oscillating signal at the output of the preamplifier circuit 120. As discussed above, both these aspects are disadvantageous and improved solutions for implementing and/or controlling the reset periods in preamplifier solutions like the one schematically described in FIG. 1 are highly desirable.

SUMMARY

It is therefore an object of the present invention to provide an improved reset arrangement for a preamplifier circuit that allows for short reset periods and prompt resumption of normal operation of the preamplifier circuit after a reset period.

In the following a simplified summary of some embodiments of the present invention is provided in order to facilitate a basic understanding of an improved CSA design. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with an example embodiment, a preamplifier circuit is provided, the preamplifier circuit comprising an amplifier arranged in a first current path between an input node and an output node of the preamplifier circuit; a feedback capacitor arranged in a second current path between said input node and said output node; a feedback circuit having an adjustable transfer function arranged in a third current path between said input node and said output node; a reset switch arranged in said third current path to enable selectively coupling the output of the feedback circuit to the input of the amplifier and decoupling the output of the feedback circuit from the input of the amplifier; and a loop controller arranged to selectively, in dependence of a voltage in the preamplifier circuit, one of open the reset switch to set the preamplifier circuit in a normal operating mode and close the reset switch to set the preamplifier circuit in a reset mode, wherein the loop controller is arranged to adjust the transfer function of the feedback circuit at least in part in dependence of the current operating mode of the preamplifier circuit.

In accordance with another example embodiment, a radiation detector assembly is provided, the radiation detector assembly comprising a preamplifier circuit according to the example embodiment described in the foregoing; and a radiation detector element having its output coupled to the input node of the preamplifier circuit.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The verbs "to comprise" and "to include" are used in this document as open limitations that neither exclude nor require the existence of also un-recited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF DRAWINGS

The embodiments of the invention are illustrated by way of example, and not by way of limitation, in the figures of the accompanying drawings, where FIG. 1 schematically illustrates a general structure of a preamplifier circuit comprising a charge sensitive amplifier known in the art.

DETAILED DESCRIPTION

Along the lines described in the foregoing with references to FIG. 1, the preamplifier circuit 120 relying on a CSA provides good and reliable amplification performance only when the voltage of the signal at the output of the preamplifier circuit 120 is kept within a predefined range that depends on characteristics of the preamplifier circuit 120. When used as a preamplifier for amplifying the detector signal from the radiation detector element 110, the output of the preamplifier circuit 120 is basically descriptive of a combined effect of the radiation-induced signal charge accumulated in the feedback capacitor $C_f$ and the charge accumulated therein due to a leakage current in the radiation detector element 110 and, therefore, when the detector assembly 100 as applied to detect radiation in its environment, the preamplifier circuit 120 needs to be reset before the charge accumulated in the feedback capacitor $C_f$ reaches a certain charge threshold (and hence before the amplified detector signal at the output of the preamplifier circuit 120 reaches a corresponding voltage threshold). Further along the lines described in the foregoing, straightforward approach of keeping the reset switch $S_1$ open for normal operation of the preamplifier circuit 120 and periodically keeping the reset switch $S_1$ closed for resetting the preamplifier circuit 120 for a short period of time leads either to slow reset of the preamplifier circuit 120 and/or to oscillations (also called ringing) in the output signal of the preamplifier circuit 120, which both are detrimental for the overall performance of the preamplifier circuit 120.

Figure 2A:
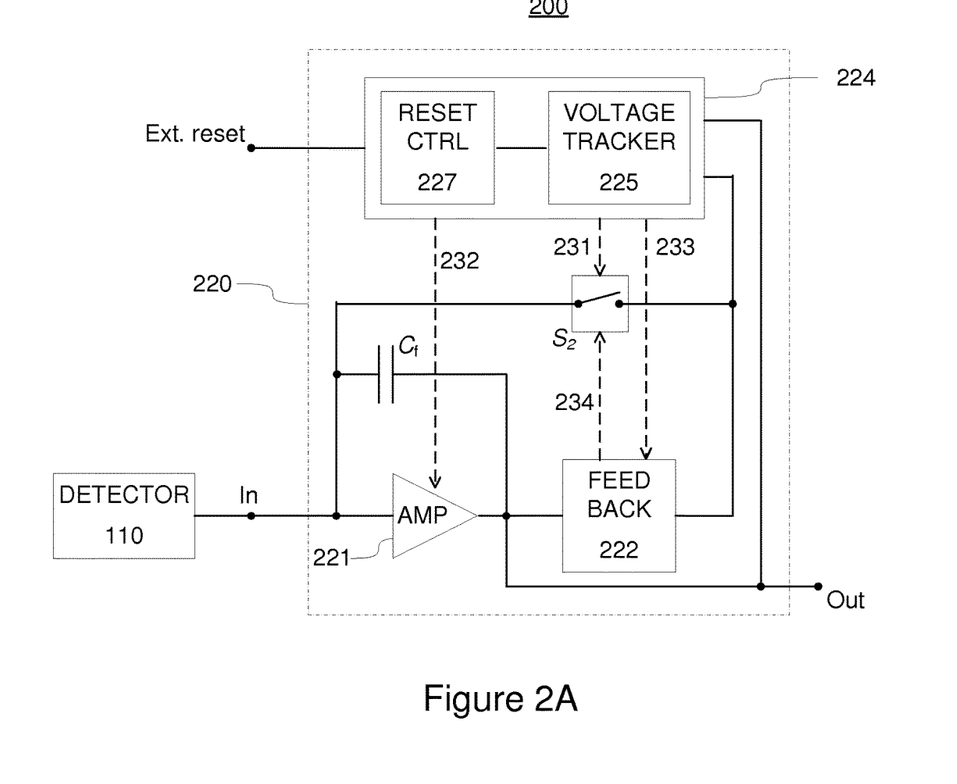
FIG. 2A schematically illustrates a preamplifier circuit according to an example.

FIG. 2A schematically illustrates a detector assembly 200, which includes the radiation detector element 110 having its output coupled to an input node of a preamplifier circuit 220. Hence, the preamplifier circuit 220 is arranged to amplify the detector signal provided at its input node into an amplified detector signal for provision via its output node, which may be coupled to a signal processing system that is applied for processing the amplified detector signal. As a non-limiting example, the radiation detector element 110 may comprise a semiconductor radiation detector such as an SDD. In the following, for brevity and clarity of description, the input node of the preamplifier circuit 220 is referred to simply as an input (of the preamplifier circuit 220) and the output node of the preamplifier circuit 220 is referred to simply as an output (of the preamplifier circuit 220). Although examples provided in this disclosure describe the usage of the preamplifier circuit 220 for amplification of detector signals from the radiation detector element 110, this is a non-limiting example chosen for clarity and brevity of description, while the preamplifier circuit 220 is applicable for amplification of signals from sources different from the radiation detector element 110. Moreover, although designated in the disclosed examples as a preamplifier, this is a non-limiting example and the preamplifier circuit 220 is applicable for use as an amplifier circuit that does not necessarily serve as a preamplifier.

In the example of FIG. 2A, the preamplifier circuit 220 comprises an amplifier 221 having its input coupled to the input of the preamplifier circuit 220, whereas the output of the amplifier 221 is coupled to the output of the preamplifier circuit 220. As in the preamplifier circuit 120, also in the example of FIG. 2A the preamplifier circuit 220 the feedback capacitor $C_f$ is coupled in parallel with the amplifier 221, in other words between the input and output of the amplifier 221, the amplifier 221 and the feedback capacitor $C_f$ thereby constituting a CSA. The amplifier 221 may comprise, for example, a folded cascode amplifier. The input stage of the amplifier 221 may comprise, for example, a field-effect transistor (FET), which may have a linear, round or convex polygon (e.g. octagon) form. The output of the amplifier 221 is further coupled to an input of a feedback circuit 222, and a (signal) output of the feedback circuit 222 is coupled to the input of the amplifier 221 via a reset switch $S_2$. The amplifier 221 comprises an amplifier circuit that has an adjustable gain. The feedback circuit 222 comprises a circuit arrangement that has an adjustable transfer function. In some examples, the feedback control circuit 222 may be arranged to adjust or modify bias of the reset switch $S_2$ in accordance with one or more control signals received from a loop controller 224 (which will be described in more detail via examples provided in the following). In this regard, the feedback circuit 222 may be arranged to control the bias of the reset switch $S_2$ via a control output of the feedback circuit 222.

The reset switch $S_2$ may be applied to set the preamplifier circuit 220 to operate in a normal operating mode or in a reset mode. The reset switch $S_2$ may be implemented by using a suitable transistor arrangement, which in some examples may have an adjustable bias. Non-limiting examples of implementing the reset switch $S_2$ are described in the following. The feedback circuit 222 may adjust the bias of the reset switch $S_2$ under control of the loop controller 224 and the bias adjustment may be carried out at least partially in dependence of characteristics (e.g. voltage and/or current) of the signal received at the input of the feedback circuit 222. As a particular example, the feedback circuit 222 may set or adjust the bias of the reset switch $S_2$ differently in dependence of the current operating mode of the preamplifier circuit 220 and/or in dependence of the current transfer function of the feedback circuit 222.

The output signal from the amplifier 221 is processed through the feedback circuit 222. As described in the foregoing, the feedback circuit 222 may have an adjustable (e.g. selectable) transfer function and the (signal) output of the feedback circuit 222 may be derived on basis of the output signal from the amplifier 221 in accordance with the currently applied transfer function. These and other aspects pertaining to an internal structure and/or operation of the feedback circuit 222 are described via examples in the following.

In the example of FIG. 2A, the preamplifier circuit 220 further includes a loop controller 224 having the output of the feedback circuit 222 and the output of the preamplifier circuit 220 (and hence the output of the amplifier 221) coupled thereto. The loop controller 224 is arranged to control the reset switch $S_2$ based at least in part on voltage at the output of the feedback circuit 222 and/or the voltage at the output of the amplifier 221, and the loop controller 224 is further arranged to adjust operation of the amplifier 221 and/or operation of the feedback circuit 222 at least in part in dependence of the current operating mode of the preamplifier circuit 220. The adjustment in this regard may comprise, for example, one or more of the following:

The loop controller 224 may be arranged to adjust the gain of the amplifier 221 at least in part in dependence of the current operating mode of the preamplifier circuit 220.

The loop controller 224 may be arranged to adjust (e.g. select) the transfer function of the feedback circuit 222 at least in part in dependence of the current operating mode of the preamplifier circuit 220 and/or control the feedback circuit 222 to adjusting or selecting the bias of the reset switch $S_2$ accordingly.

In other words, each of the reset switch $S_2$, the amplifier 221 and the feedback circuit 222 may operate at least partially under control of the loop controller 224. The loop controller 224 may provide control of the reset switch $S_2$ via one or more control signals 231 (shown as a dashed line in FIG. 2). Along similar lines, the loop controller may provide adjustment of the amplifier 221 and/or the feedback circuit 222 via one or more respective control signals 232, 233 (likewise shown as respective dashed line in FIG. 2A). The control signal(s) 231 issued to the reset switch $S_2$ may comprise one or more control signals that cause setting the reset switch $S_2$ into the open state or setting the reset switch $S_2$ to the closed state. The control signal(s) 232 issued to the amplifier 221 may comprise one or more control signals that cause setting or adjusting the gain of the amplifier 221 accordingly. Along similar lines, the control signal(s) 233 issued to the feedback circuit 222 may comprise one or more control signals that cause adjusting or selecting the transfer function of the feedback circuit 222 accordingly. The control signal(s) 233 may comprise, for example, an indication of the current operating mode of the preamplifier circuit 220.

As illustrated in FIG. 2A, the loop controller 224 may comprise a voltage tracker 225 and a reset controller 227. The operation provided by these two elements of the loop controller 224 is described in the following via non-limiting examples. With respect to control of the reset switch $S_2$, the loop controller 224 is arranged to control setting the preamplifier circuit 220 in one of the normal operating mode and the reset mode via setting the reset switch $S_2$ into one of an open state and a closed state: setting the reset switch $S_2$ in the open state results in operating the preamplifier circuit 220 in the normal operating mode, during which the amplifier 221 of the preamplifier circuit 220 serves to amplify the detector signal into the amplified detector signal, whereas setting the reset switch $S_2$ in the closed state results in operating the preamplifier circuit 220 in the reset mode, during which the output of the amplifier 221 may be undefined and hence may not be applicable as the amplified detector signal. A period of operating the preamplifier circuit 220 in the reset mode may be referred to, as described in the foregoing, as a reset period and it may be considered as 'dead time' of the output of the preamplifier circuit 220.

Figure 2B:
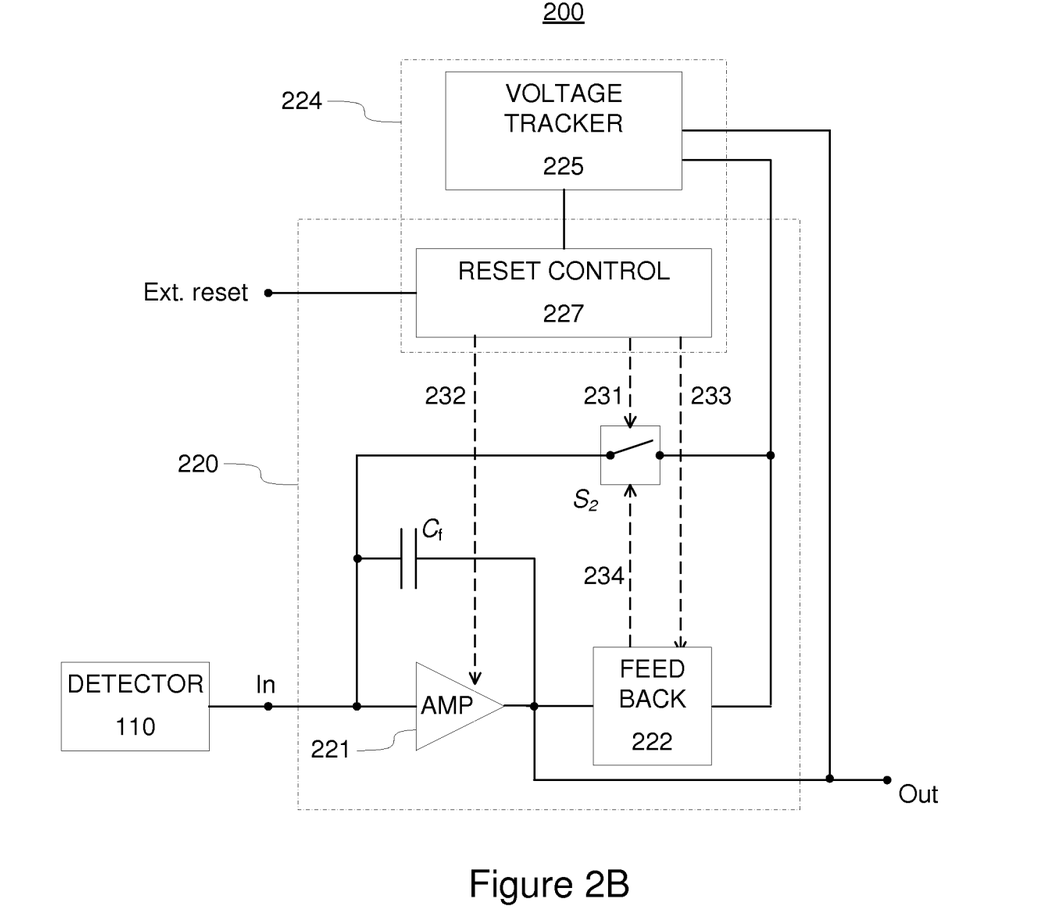
FIG. 2B schematically illustrates a preamplifier circuit according to an example.

FIG. 2B schematically illustrates a variation of the detector assembly 200 depicted in FIG. 2A, where only part of the loop controller 224 is provided as part of the preamplifier circuit 220. In particular, in the example of FIG. 2B the reset controller 227 is provided as part of the preamplifier circuit 220 while the voltage tracker 225 is provided outside the preamplifier circuit 220. Consequently, in the example of FIG. 2B the reset controller 227 provided within the preamplifier circuit 220 receives control signals from the voltage tracker 225 that is outside the preamplifier circuit 220 and derives respective control signals 232, 233, 231 for adjusting the operation of the amplifier 221 and/or the operation of the feedback circuit 222 as well as a control signal for setting the reset switch $S_2$ into one of the open state and closed state.

The preamplifier circuit 220 may comprise further elements in addition to those depicted in the illustrations of FIGS. 2A and 2B. Hence, in general terms the preamplifier circuit 220 comprises the amplifier 221 arranged in a first current path between the input and output nodes of the preamplifier circuit 220 and the feedback capacitor $C_f$ is arranged in a second current path between the input and output nodes of the preamplifier circuit 220. Moreover, the preamplifier circuit comprises the feedback circuit 222 and the reset switch $S_2$ arranged between a third current path between the input and output nodes of the preamplifier circuit 220, the reset switch $S_2$ thereby enabling selectively coupling the output of the feedback circuit 222 to the input of the amplifier 221 (to set the preamplifier circuit 220 to operate in the reset mode) or decoupling the output of the feedback circuit 222 from the input of the amplifier 221 (to set the preamplifier circuit 220 to operate in the normal operating mode).

In the normal operating mode of the preamplifier circuit 220, i.e. when the reset switch $S_2$ is open, the gain of the amplifier 221 may be controlled (e.g. in response to the control signal(s) 232 from the loop controller 224) such that the amplifier applies a predefined static gain that serves to provide a desired amplification performance in view of the (expected) characteristics of the signal provided at the input of the preamplifier circuit 220 (e.g. the detector signal from the radiation detector element 110) and/or in view of characteristics of a circuit or system coupled to the output of the preamplifier circuit 220 (e.g. the signal processing system intended for processing the amplified detector signal). As a non-limiting example, the gain of the amplifier 221 during the normal operating mode may be a suitable value that, for example, results in desired amplification in a range from a few decibels (dB) up to 100 dB.

In an example, in the normal operating mode of the preamplifier circuit 220, the transfer function of feedback circuit 222 may be selected or adjusted in a predefined manner. The transfer function applied in the normal operating mode of the preamplifier circuit 220 may be arranged to reduce or minimise the leakage current through the reset switch $S_2$, from a terminal (e.g. an 'input node' and/or an 'output node') of the reset switch $S_2$ to the (semiconductor) substrate and/or from a bulk node of the reset switch $S_2$ to the (semiconductor) substrate. As an example in this regard, the transfer function of the feedback circuit 222 during the normal operating mode may be a fixed predefined transfer function. In another example, the transfer function during the normal operating mode may be (further) selected or adjusted in dependence of the voltage at the output of the feedback circuit 222 and/or in dependence of the voltage at the output of the preamplifier circuit 220.

Still referring to operation of the preamplifier circuit 220 in the normal operating mode, the feedback circuit 222 may be arranged to set or adjust the bias of the reset switch $S_2$ in order to reduce or minimize the leakage current through the reset switch $S_2$, from a terminal (e.g. an 'input node' and/or an 'output node') of the reset switch $S_2$ to (semiconductor) substrate and/or from a bulk node of the reset switch $S_2$ to the (semiconductor) substrate. In this regard, the bias control may comprise, for example, the feedback circuit 222 issuing, via the control output of the feedback circuit 222, one or more bias control signals 234 that cause setting or adjusting the bias voltage and/or bias current of the reset switch $S_2$ accordingly. As a non-limiting example in this regard, the bias voltage of the reset switch $S_2$ may be set to track the input voltage of amplifier 221 to minimize the voltage over the reset switch $S_2$. Another non-limiting example comprises setting the bias voltage to a value causing a small leakage current through the reset switch $S_2$ in order to compensate voltage change at the input of the amplifier 221 due to any other current, for example one caused by the detector element 110 coupled to the input of the preamplifier circuit 220.

Figure 2C:
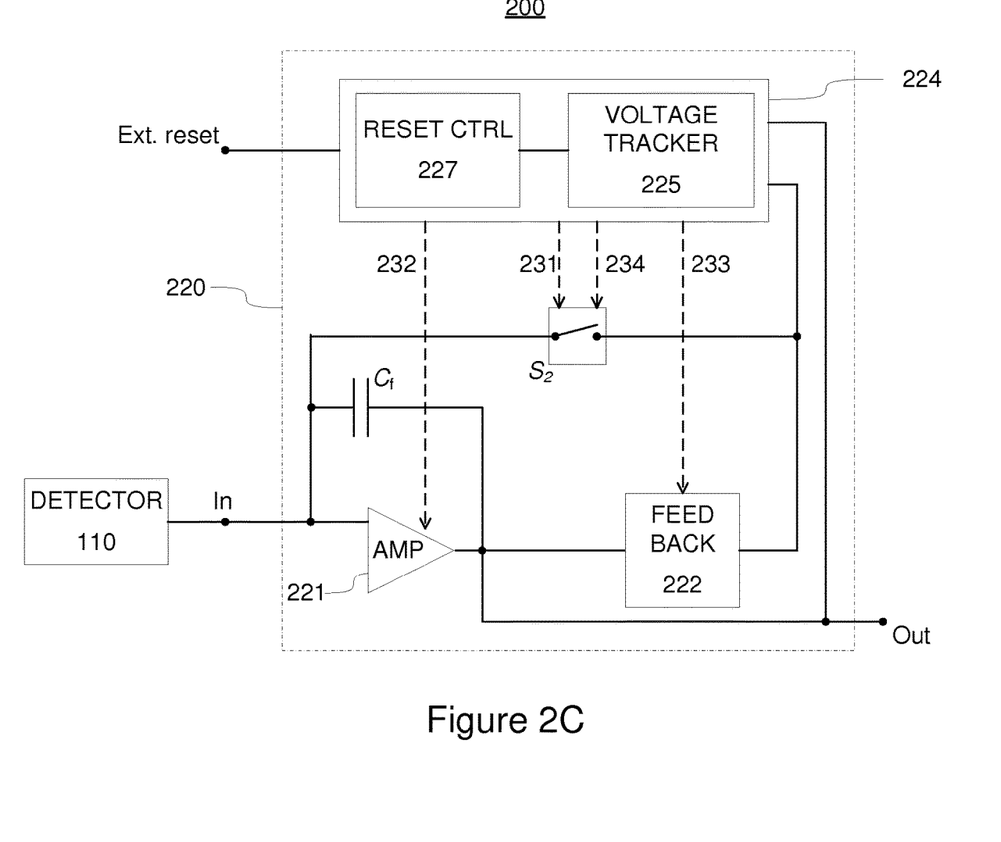
FIG. 2C schematically illustrates a preamplifier circuit according to an example.

FIG. 2C schematically illustrates another variation of the detector assembly 200 depicted in FIG. 2A, where the bias control of the reset switch $S_2$ via the bias control signal(s) 234 is provided by the loop controller 224 (e.g. by the reset controller 227) instead of the feedback circuit 222. Even though illustrated in FIG. 2C as a variation of the detector assembly 200 according to the example of FIG. 2A, a similar modification with respect to provision of the bias control of the reset switch $S_2$ may be applied in the detector assembly 200 according to the example of FIG. 2B as well.

Herein, the bias control signal(s) 234 are to be construed broadly, encompassing e.g. an actual bias voltage and/or bias current or respective control signal(s) that enable connecting the reset switch $S_2$ to a voltage source providing a bias voltage in accordance with the respective control signal(s) and/or providing a bias current in accordance with the respective control signal(s). Regardless of the manner of implementing the bias control signal(s) 234, the voltage source for providing the bias voltage may be provided as part of the preamplifier circuit 220 or an external voltage source may be applied. Along similar lines, alternatively or additionally, regardless of the manner of implementing the bias control signal(s) 234, the current source for providing the bias current may be provided as part of the preamplifier circuit 220 or an external current source may be applied.

Figure 3A:
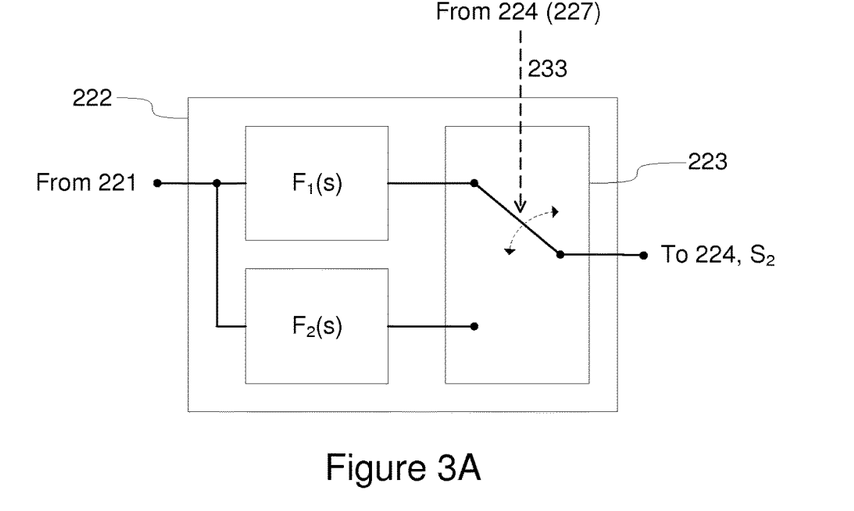
FIG. 3A illustrates a block diagram of some components of a feedback circuit according to an example.

FIG. 3A illustrates a block diagram of some logical components of the feedback circuit 222 according to a non-limiting example. In the schematic illustration of FIG. 3, the output of the amplifier 221 is coupled to a first transfer function $F_1(s)$ and to a second transfer function $F_2(s)$, whereas one of the first and second transfer functions $F_1(s)$, $F_2(s)$ is selectively coupled to the output of the feedback circuit 222 by setting a switch 223 in accordance with the control signal(s) 233 received from the loop controller 224 (e.g. from the reset controller 227). Therein, for example, the first transfer function $F_1(s)$ may be selected in response to the control signal(s) 233 indicating the normal operating mode of the preamplifier circuit 220 and the second transfer function $F_2(s)$ may be selected in response to the control signal(s) 233 indicating the reset mode of the preamplifier circuit 220. The first and second transfer functions $F_1(s)$, $F_2(s)$ may differ from each other in amplitude and/or frequency response they serve to provide. In this regard, the amplitude resulting from the second transfer function $F_2(s)$ may be smaller than that resulting from the first transfer function $F_1(s)$ and/or the frequency response of the second transfer function $F_2(s)$ may extend over a wider range of frequencies than that resulting from the first transfer function $F_1(s)$.

Figure 3B:
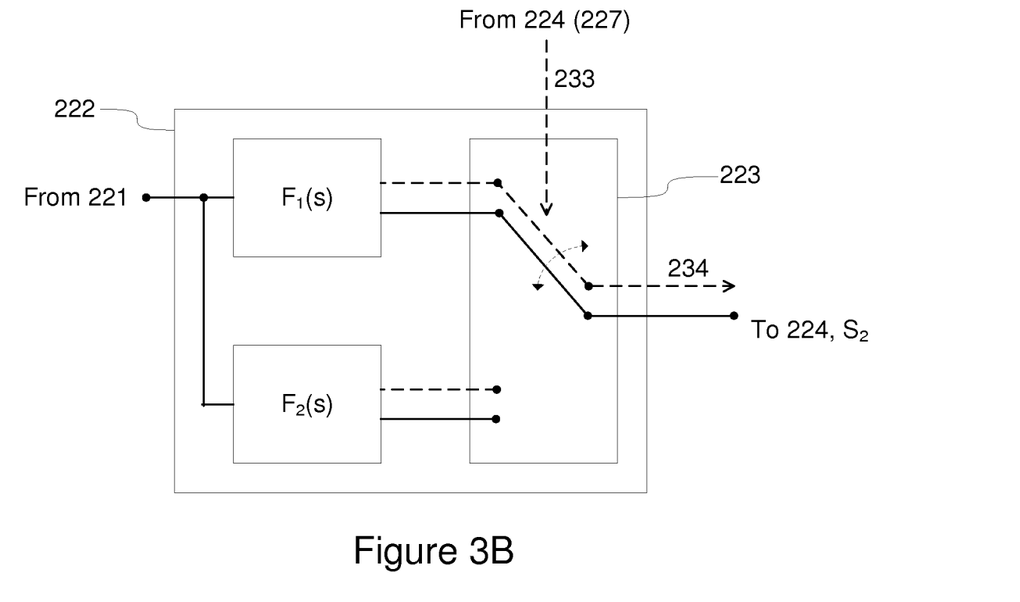
FIG. 3B illustrates a block diagram of some components of a feedback circuit according to an example.

FIG. 3B illustrates a block diagram of some logical components of the feedback circuit 222 according to another non-limiting example, where also the biasing of the reset switch $S_2$ is provided via the feedback circuit 222. Therein, in addition to the operation described above with references to FIG. 3A, selection of the transfer function of the feedback circuit 222 further implies selection of bias control signal(s) 234 accordingly in accordance with the control signal(s) 233 received from the loop controller 224 (e.g. from the reset controller 227), thereby adjusting the bias of the reset switch in 222 in dependence of the current operating mode of the preamplifier circuit 220.

It should be noted, however, that the description of the first and second transfer functions $F_1(s)$, $F_2(s)$ with references to the examples of FIGS. 3A and 3B is a conceptual one: even though shown in FIGS. 3A and 3B as separate and independent logical blocks for graphical clarity of the illustration, the first and second transfer functions $F_1(s)$, $F_2(s)$ may be provided by respective circuitries that share one or more components and/or one or more of the (shared) components of the circuitry that serves to provide the first and second transfer functions $F_1(s)$, $F_2(s)$ is adjusted to operate differently in the normal operating mode and in the reset mode.

An advantage arising from controlling the bias of the reset switch $S_2$ and/or selecting or adjusting the transfer function of the feedback circuit 222 during the normal operating mode as described in the foregoing of the preamplifier circuit 220 is reduced noise level in the (amplified) signal at the output of the preamplifier circuit 220 due to reduced or even completely eliminated leakage current through the reset switch $S_2$ (e.g. through the transistor arrangement that may be applied to implement the reset switch $S_2$).

Figure 4:
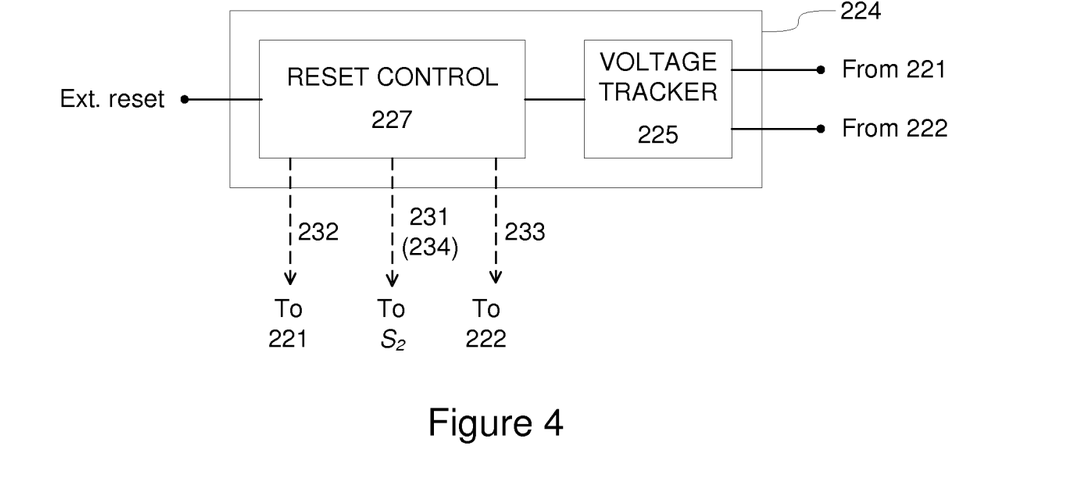
FIG. 4 illustrates a block diagram of some components of a loop controller for a preamplifier circuit according to an example.

As described in the foregoing, the loop controller 224 is coupled to the output of the feedback circuit 222 and to the output of the preamplifier circuit 220 (i.e. to the output of the amplifier 221), and it hence receives respective output signals from the feedback circuit 222 and from the amplifier 221. FIG. 4 illustrates a block diagram of some components of the loop controller 224 according to an example. As also illustrated in FIGS. 2A, 2B and 2C, the loop controller 224 may comprise the voltage tracker 225 and the reset controller 227 and the loop controller 224 (e.g. the reset controller 227) may issue the one or more control signals 231 for selectively opening or closing the reset switch $S_2$, the one or more control signals 232 for setting or adjusting the gain of the amplifier 221 and the one or more control signals 233 for adjusting or selecting the transfer function of the feedback circuit 222. Moreover, in examples where the bias control of the reset switch $S_2$ is provided by the loop controller 224, the loop controller 224 (e.g. the reset controller 227) may issue the one or more bias control signals 234.

During the normal operating mode of the preamplifier circuit 220, according to an example, the voltage tracker 225 compares the voltage at the output of the feedback circuit 222 to a predefined threshold voltage $V_{th,222}$ and triggers a reset period in response to the voltage at the output of the feedback circuit 222 exceeding the voltage threshold $V_{th,222}$. Such triggering may involve the voltage tracker 225 issuing a trigger signal or trigger command to the reset controller 227, which may apply the control signal(s) 231 to operate the reset switch $S_2$ accordingly. According to an example, the reset controller 227 closes the reset switch $S_2$ directly in response to triggering of the reset period, thereby initiating the reset period without an additional delay. According to another example, triggering of the reset period results in the reset controller 227 setting a timer to run for a first predefined time period and the reset controller 227 closing the reset switch $S_2$ in response to the timer elapsing, thereby initiating the reset period after the first predefined time period has elapsed.

In another example, the voltage tracker 225 may be arranged to monitor the voltage at the output of the amplifier 221 (i.e. at the output of the preamplifier circuit 220) instead of the voltage at the output of the feedback circuit 222 and to trigger a reset period in response to the voltage at the output of the amplifier 221 exceeding a predefined voltage threshold $V_{th,221}$. In a further example, the voltage tracker may be arranged to monitor both the voltage at the output of the feedback circuit 222 and at the output of the amplifier 221 and to trigger a reset period in response to the voltage at the output of the feedback circuit 222 exceeding the voltage threshold $V_{th,222}$ and/or the voltage at the output of the amplifier 221 exceeding the voltage threshold $V_{th,221}$.

In the above example of the voltage tracker 225 triggering a reset period in response to the voltage at the output of the feedback circuit 222 exceeding the voltage threshold $V_{th,222}$ and/or the voltage at the output of the amplifier 221 exceeding the voltage threshold $V_{th,221}$, an underlying assumption that the respective output voltages saturate towards a certain respective maximum voltage (that depends on characteristics of the amplifier 221). In an alternative example, the output voltages of the feedback circuit 222 and the amplifier 221 saturate towards a ground potential and in such an approach, during the normal operating mode of the preamplifier circuit 220, the voltage tracker 225 compares the voltage at the output of the feedback circuit 222 to a predefined threshold voltage $V'_{th,222}$ and/or compares the voltage at the output of the amplifier 221 to a predefined threshold voltage $V'_{th,221}$ and triggers a reset period in response to the voltage at the output of the feedback circuit 222 failing to exceed the voltage threshold $V'_{th,222}$ (i.e. falling below the voltage threshold $V'_{th,222}$) and/or the voltage at the output of the amplifier 221 failing to exceed the voltage threshold $V'_{th,221}$ (i.e. falling below the voltage threshold $V'_{th,221}$). Along the lines described above, triggering of the reset period may result in the reset controller 227 initiating the reset period without a delay or after a delay defined by the first time period via the control signal(s) 231.

In a further example, the loop controller 224 may optionally further comprise an input for receiving an external reset signal (as illustrated in FIGS. 2A, 2B and 4). Reception of the external reset signal (e.g. a reset command or a reset pulse) via this input causes the loop controller 224 to trigger a reset period and, consequently, causes the reset controller 227 to initiate the reset period without a delay or after a delay defined by the first time period. In a yet further example, the loop controller 224 may omit (operation of) the voltage tracker 225 and trigger a reset period according to a predefined profile instead, e.g. at predefined time intervals. In this scenario, triggering of a reset period typically results in the reset controller 227 initiating the reset period without a delay.

In the reset mode, the operation of the amplifier 221 may be adjusted by the reset controller 227, via the one or more control signals 232, such that the gain of the amplifier 221 is set or adjusted to a smaller value than the predefined static value applied during the normal operating mode of the preamplifier circuit 220. The gain control may involve directly setting or adjusting the gain of the amplifier 221 or otherwise adjusting operation of the amplifier 221 such that its gain gets adjusted in a desired manner. In the reset mode, the gain of the amplifier 221 (e.g. an open loop gain) is brought down to a small value that is less than unity (e.g. less than 1 or less than 0 dB, depending on the exact manner of defining or expressing the gain of the amplifier 221). Non-limiting examples in this regard include the reset controller 227 issuing one or more control signals that cause setting or adjusting the gain of the amplifier 221 into a second predefined static value that is smaller than the predefined static value applied during the normal operating mode of the preamplifier circuit 220, the reset controller 227 issuing one or more control signals that result in setting or adjusting the gain of the amplifier in accordance with a predefined function of time, or the reset controller 227 issuing one or more control signals that result in adjusting the gain of the amplifier 221 during the reset mode in dependence of the voltage at the output of the amplifier 221 and/or in dependence of the voltage at the output of the feedback circuit 222. Reducing the gain of the amplifier 221 during the reset mode contributes, for example, towards prompt completion of the reset period and/or towards reducing oscillations (so-called ringing effect) and/or other undesired non-linear effects in the output signal of the preamplifier circuit 220 during and immediately following the reset period.

Still referring to operation in the reset mode, the reset controller 227 operates to adjust operation of at least one aspect of the preamplifier circuit 220 to facilitate controlled discharging of the charge accumulated to the feedback capacitor $C_f$. In this regard, the reset controller 227 may be arranged to adjust operation of the feedback circuit 222 such that it sets or adjusts the bias of the reset switch $S_2$ such that it enables prompt discharging of the feedback capacitor $C_f$. In this regard, as described in the foregoing, the bias control may comprise, for example, the feedback circuit 222 issuing one or more bias control signals 234 that cause setting or adjusting the bias voltage and/or bias current of the reset switch $S_2$ accordingly. As a non-limiting example in this regard, the bias voltage of the reset switch $S_2$ may be set to the lowest potential available in the circuit to increase reset current and/or to reduce reset time. In another example, as also described in the foregoing, the bias control of the reset switch $S_2$ may be, alternatively, provided via the loop controller 224 (e.g. by the reset controller 227).

As another example of the reset controller 227 adjusting operation of the preamplifier circuit 220 in the reset mode, the one or more control signals 233 from the reset controller 227 may result in setting or adjusting operation of the feedback circuit 222 during the reset period e.g. in one of the following ways:

In an example, the transfer function of the feedback circuit 222 is adjusted or selected in accordance with a predefined function of time. In this regard, operation of the feedback circuit 222 may be adjusted such that its transfer function changes according to a predefined cycle, pattern or rule.

In another example, the transfer function of the feedback circuit 222 is adjusted or selected in dependence of the voltage at the output of the amplifier 221.

Hence, during the reset period, the transfer function of the feedback circuit 222 may vary over time. The changes in operation of the feedback circuit 222 during the reset period may result in changes in the overall transfer function of the feedback loop through the feedback circuit 222 and the amplifier 221 during the reset period. This, in turn, results in a reduction of the output voltage of the preamplifier circuit 220 and hence in the input voltage of the feedback circuit 222, which may result in abnormal operation of the feedback circuit 222 due to its input voltage being outside its predefined input voltage range.

Like reduction of the gain of the amplifier 221 during the reset mode, also selection or adjustment of the transfer function of the feedback circuit 222 and/or bias control of reset switch $S_2$ during the reset mode of the preamplifier circuit 220 contribute, for example, towards prompt completion of the reset period and/or towards reducing oscillations (so-called ringing effect) and/or other undesired non-linear effects in the output signal of the preamplifier circuit 220 during and immediately following the reset period.

The reset period may have a fixed predefined duration, or the duration of the reset period may be variable and depend on a characteristic in a certain point of the preamplifier circuit 220, e.g. on a voltage at the output of the amplifier 221 (i.e. the voltage at the output of the preamplifier circuit 220). As an example of the former approach, the reset controller 227 may be arranged to set, upon initiation of the reset period, a timer to run for a second predefined time period and to open the feedback switch $S_2$ in response to the timer elapsing, thereby providing a reset period having the fixed predefined duration. As non-limiting examples of the latter approach, the reset controller 227 may be arranged to open the feedback switch $S_2$ in response to the voltage at the output of the amplifier 221 or in response to the voltage at some other predefined point of the feedback amplifier circuit 220 failing to exceed a predefined voltage threshold $V_{th,reset}$, thereby terminating the reset period after detecting (sufficient extent of) discharging of the feedback capacitor $C_f$ having taken place.

As described in the foregoing, the reset switch $S_2$ may be provided using a suitable transistor arrangement. An advantageous design of the reset switch $S_2$ aims at minimizing the noise arising from a leakage current through the reset switch $S_2$ during operation in the normal mode, i.e. when the reset switch $S_2$ is in the open state. Typically, significant sources of noise in transistor arrangements relying on one or more FETs include resistive channel thermal noise and channel flicker (1/f) noise. Moreover, when targeting at very low noise solutions, further noise sources include thermal noise originating from gate and substrate resistances, leakage current induced shot noise from drain-substrate and source-substrate diodes. In this regard, usage of one or more isolated MOS devices (PMOS or NMOS) in implementing the reset switch $S_2$ is advantageous since they serve to reduce the effect of such noise sources. As an example in this regard, see for example the article by Ahmed Helmy and Mohammed Ismail titled "The CHIP— A Design Guide for Reducing Substrate Noise Coupling in RF Applications" in IEEE Circuits & Devices Magazine, Vol. 22, Issue 5, September-October 2006 for an in-depth discussion on signal isolation in chips such as MOS devices.

Figure 5A:
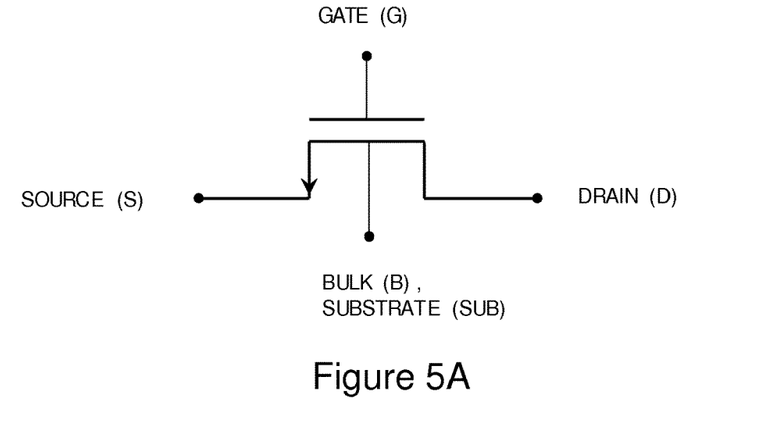
FIG. 5A schematically illustrates a reset switch for a preamplifier circuit according to an example.

Usage of the isolated NMOS device enables biasing of a bulk terminal separately from the substrate of the circuit. This makes it possible to select bulk and substrate bias voltages in a manner that results in minimising leakage currents of a switch constructed using an isolated MOS transistor. Also noise coupling from the substrate can be minimized by the aid of an isolated MOS transistor, because an additional reverse biased pn-junction is formed between transistor bulk and circuit substrate. Moreover, isolated MOS devices also provide protection against electrostatic discharge (ESD) due to the diode-stack structure applied therein also in such MOS devices of small size that are typically applied to enable reaching low noise level. Non-limiting examples of such designs for the reset switch $S_2$ are described in the following:

FIG. 5A schematically illustrates a NMOS-based reset switch $S_2$ according to an example, where the reset switch $S_2$ is provided as a four-terminal NMOS device. Therein, the source of the NMOS device is coupled to the input of the amplifier 221, the drain of the NMOS device is coupled to the output of the feedback circuit 222 and the gate of the NMOS device is coupled to a control output of the reset controller 227. The biasing of the NMOS device (possibly under control of the bias control signal(s) from the feedback circuit 222 or from the loop controller 224) may be provided via the bulk/substrate terminal of the NMOS device.

Figure 5B:
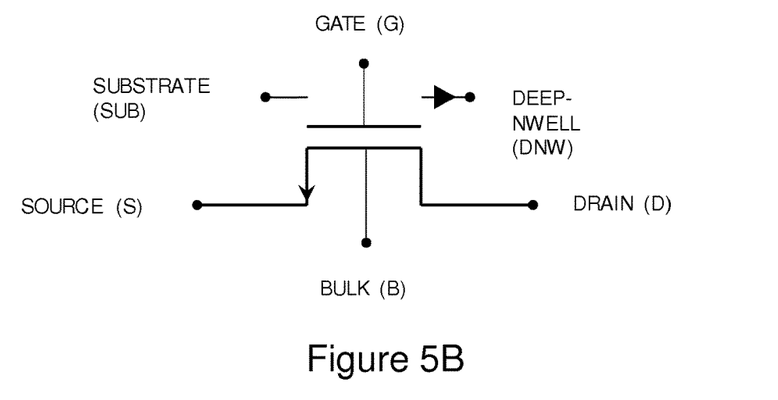
FIG. 5B schematically illustrates a reset switch for a preamplifier circuit according to an example.

FIG. 5B schematically illustrates another NMOS-based reset switch $S_2$ according to an example, where the reset switch $S_2$ is provided as a six-terminal NMOS device. Therein, the source of the NMOS device is coupled to the input of the amplifier 221, the drain of the NMOS device is coupled to the output of feedback circuit 222, and the gate of the NMOS device is coupled to a control output of the reset controller 227. The biasing of the NMOS device (possibly under control of the bias control signal(s) from the feedback circuit 222 or from the loop controller 224) may be provided via the bulk/substrate/deep-nwell terminal of the NMOS device.

Figure 5C:
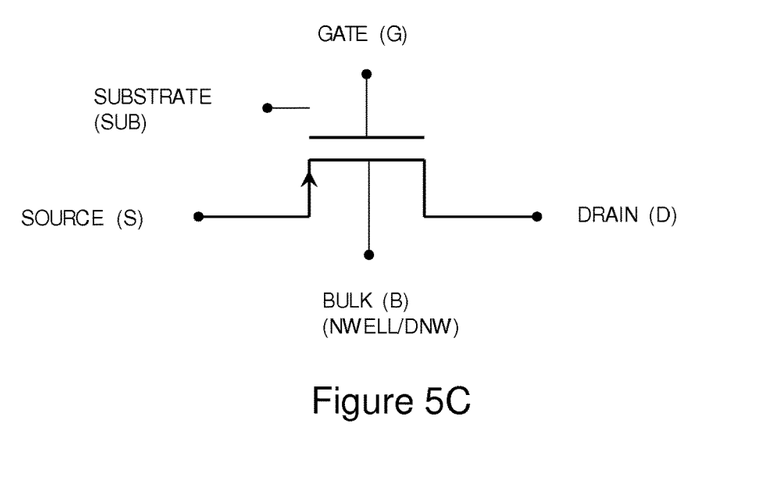
FIG. 5C schematically illustrates a reset switch for a preamplifier circuit according to an example.

FIG. 5C schematically illustrates a PMOS-based reset switch $S_2$ according to an example, where the reset switch $S_2$ is provided as a five-terminal PMOS device. Therein, the source of the PMOS device is coupled to the input of the amplifier 221, the drain of the PMOS device is coupled to the output of the feedback circuit 222, and the gate of the PMOS device is coupled to a control output of the reset controller 227. The biasing of the PMOS device (possibly under control of the bias control signal(s) from the feedback circuit 222 or from the loop controller 224) may be provided via the bulk/nwell terminal of the PMOS device.

Figure 6:
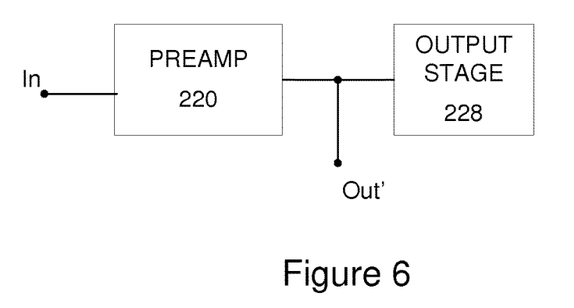
FIG. 6 schematically illustrates an output stage according an example.

As schematically illustrated in FIG. 6, the output of the preamplifier circuit 220 may be coupled to a circuit or signal processing system that is applied for processing the amplified detector signal including an output stage 228 that is provided for stabilizing the preamplifier circuit 220 and for reducing the time it takes to discharge the feedback capacitor $C_f$ during a reset period. The output stage 228 basically serves as a circuit having a varying impedance coupled in parallel with the preamplifier circuit 220, and advantageous effects arising from usage of the output stage 228 may (further) include reduced electrical noise in the amplified detector signal and/or (improved) ESD protection.

Figure 7A:
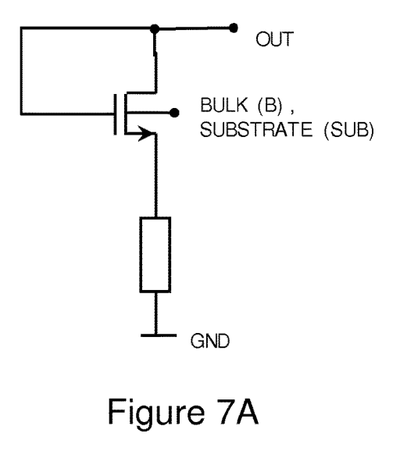
FIG. 7A schematically illustrates a pull-down circuit for a preamplifier circuit according to an example.

The output stage 228 may comprise a pull-down circuit or a pull-up circuit. Although illustrated in the example of FIG. 6 as an entity that is separate from the preamplifier circuit 220, the output stage 228 may be provided as an element that is included in the preamplifier circuit 220. In such an example, the output of the output stage 228 constitutes the output of the preamplifier circuit 220. Non-limiting examples of pull-down and pull-up circuits that are applicable for use as the output stage 228 are schematically illustrated in FIGS. 7A to 7C and briefly described in the following:

FIG. 7A schematically illustrates an example of providing the output stage 228 as a diode-connected NMOS transistor.

Figure 7B:
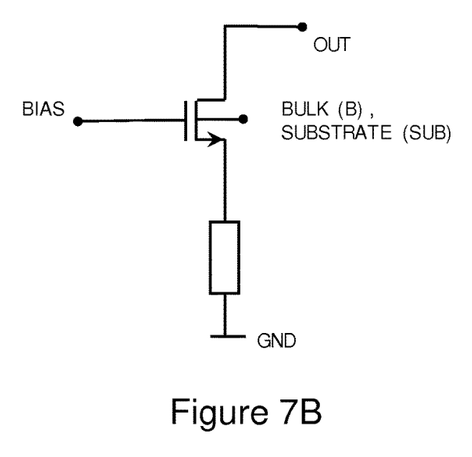
FIG. 7B schematically illustrates a pull-down circuit for a preamplifier circuit according to an example.

FIG. 7B schematically illustrates an example of providing the output stage 228 a current source NMOS transistor (a four-terminal NMOS device). Transistor bulk terminal is connected to silicon substrate in a standard arrangement.

Figure 7C:
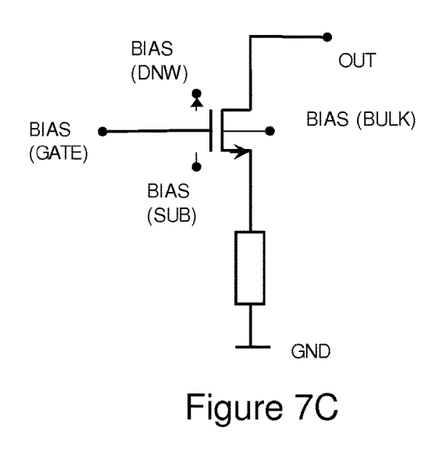
FIG. 7C schematically illustrates a pull-down circuit for a preamplifier circuit according to an example.

FIG. 7C schematically illustrates an example of providing the output stage 228 as a current source NMOS transistor (a six-terminal NMOS device). Transistor sub terminal is connected to silicon substrate in a standard arrangement. The other terminals (gate/bulk/drain) can be connected to bias voltages in a free manner to achieve a best performance in respect of noise and reset operation.

Hence, the output stage 228 may comprise a circuitry that involves a (n isolated) NMOS device and a resistor. Such an output stage 228 may serve two purposes, i.e. a pull-down (or pull-up) circuit and an ESD protection circuit. As an example in this regard, an amplifier within the output stage 228 comprising e.g. a biased MOSFET together with a source degenerated resistor may serve a pull-down circuit, whereas parasitic diode(s) of the MOSFET may serve an ESD protection structure. Usage of an isolated MOSFET provides an additional advantage of biasing or connecting the parasitic diode(s) in an optimized manner, e.g. not only towards the (semiconductor) substrate. Herein, the amplifier within the output stage 228 provides a higher output impedance in comparison to a case where only a resistor is applied. In this regard, a high value resistor arranged in the (semiconductor) substrate would require a larger area that typically incurs an increased cost and extra parasitic capacitance to the output. The amplifier within the output stage 228 further enables optimizing (e.g. minimizing) (thermal) noise in the output in comparison to a case where a separate ESD device, such as a diode, is applied.

In the foregoing, references are made to selectively operating the preamplifier circuit 220 in the normal operating mode or in the reset mode. While the exact relationship between time periods spent in each of these two modes depends e.g. on the characteristics of the signal supplied in the input of the preamplifier circuit 220 (e.g. with respect to its current, voltage and/or variations thereof over time), on the characteristics of the components applied to implement the preamplifier circuit 220 and on desired performance of the preamplifier circuit 220, in general a single period in the normal operating mode between two reset periods has typically a duration in the order of milliseconds, whereas a single period in the reset mode between two periods in the normal operating mode typically has a duration in the order of nanoseconds.

Features described in the preceding description may be used in combinations other than the combinations explicitly described. Although functions have been described with reference to certain features, those functions may be performable by other features whether described or not. Although features have been described with reference to certain embodiments, those features may also be present in other embodiments whether described or not.

The invention claimed is:

1. A preamplifier circuit for amplification of a signal, the preamplifier circuit comprising:
an amplifier arranged in a first current path between an input node (In) and an output node (Out) of the preamplifier circuit;
a feedback capacitor ($C_f$) arranged in a second current path between said input node (In) and said output node (Out);

a feedback circuit having an adjustable transfer function arranged in a third current path between said input node (In) and said output node (Out);

a reset switch ($S_2$) arranged in said third current path to enable selectively coupling the output of the feedback circuit to the input of the amplifier and decoupling the output of the feedback circuit-from the input of the amplifier; and a loop controller arranged to selectively one of open or close the reset switch ($S_2$) in dependence of either an external reset signal or a voltage in the preamplifier circuit (220) to, respectively, set the preamplifier circuit in one of a normal operating mode or a reset mode, wherein the loop controller is arranged to adjust the transfer function of the feedback circuit at least in part in dependence of the currently applied operating mode of the preamplifier circuit, wherein said currently applied operating mode comprises one of the normal operating mode or the reset mode.

2. The preamplifier circuit according to claim 1, wherein the loop controller is arranged to set a gain of the amplifier at least in part in dependence of the current operating mode of the preamplifier circuit.

3. The preamplifier circuit according to claim 1, wherein one of the feedback circuit and the loop controller is arranged to adjust bias of the reset switch ($S_2$) in dependence of the current operating mode of the preamplifier circuit.

4. The preamplifier circuit according to claim 3, wherein adjusting the bias of the reset switch ($S_2$) comprises setting at least one of a bias voltage and a bias current of said reset switch ($S_2$) in dependence of the current operating mode of the preamplifier circuit.

5. The preamplifier circuit according to claim 4, wherein adjusting the bias of the reset switch ($S_2$) comprises setting at least one of the bias voltage and the bias current during the normal operating mode of the preamplifier circuit to a respective value that results in a reduction of leakage current through the reset switch ($S_2$), and/or from a node of the reset switch ($S_2$) to a semiconductor substrate.

6. The preamplifier circuit according to claim 1, wherein the loop controller is arranged to selectively trigger opening or closing the reset switch ($S_2$) in dependence of one or more of the following: the voltage at the output node (Out) of the preamplifier circuit, the voltage at the output of the feedback circuit.

7. The preamplifier circuit according to claim 6, wherein the loop controller is arranged to carry out at least one of the following:

trigger closing the reset switch ($S_2$) in response to the voltage at the output node (Out) of the preamplifier circuit exceeding a first predefined voltage threshold, trigger closing the reset switch ($S_2$) in response to the voltage at the output of the feedback circuit exceeding a second predefined voltage threshold.

8. The preamplifier circuit according to claim 6, wherein the loop controller is arranged to carry out at least one of the following:

trigger closing the reset switch ($S_2$) in response to the voltage at the output node (Out) of the preamplifier circuit falling below a third predefined voltage threshold, trigger closing the reset switch ($S_2$) in response to the voltage at the output of the feedback circuit falling below a fourth predefined voltage threshold.

9. The preamplifier circuit according to claim 1, wherein the loop controller is arranged to carry out at least one of the following:

adjust the gain of the amplifier further in dependence of at least one of the voltage at the output of the amplifier and the voltage at the output of the feedback circuit, adjust the transfer function of the feedback circuit further in dependence of at least one of the voltage at the output of the amplifier and the voltage at the output of the feedback circuit.

10. The preamplifier circuit according to claim 1, wherein the loop controller is arranged to carry out at least one of the following:

set the gain of the amplifier to a respective predefined value in dependence of the current operating mode of the preamplifier circuit, select one of predefined transfer functions for the feedback circuit in dependence of the current operating mode of the preamplifier circuit.

11. The preamplifier circuit according to claim 1, wherein the loop controller is arranged to set the gain of the amplifier during the reset mode to a value that is smaller than that applied in the normal operating mode of the preamplifier circuit.

12. The preamplifier circuit according to claim 1, wherein the loop controller is arranged to adjust the transfer function of the feedback circuit during the reset mode of the preamplifier circuit to a value that results in a further reduction of the output voltage of the preamplifier circuit.

13. The preamplifier circuit according to claim 1, wherein the reset switch ($S_2$) comprises an isolated NMOS transistor that enables biasing a bulk terminal separately from a substrate.

14. The preamplifier circuit according to claim 1, further comprising an output stage coupled in parallel with the preamplifier circuit, wherein the output stage comprises a pull-up circuit or a pull-down circuit that comprises an isolated NMOS transistor that enables biasing a bulk terminal separately from a substrate connected in series with a resistor.

15. A radiation detector assembly comprising:
a preamplifier circuit according to claim 1; and
a radiation detector element having its output coupled to the input node (In) of the preamplifier circuit.

* * * * *